United States Patent
Botez (10) Patent No.: US 7,408,966 B2
(45) Date of Patent: Aug. 5, 2008

(54) INTERSUBBAND QUANTUM BOX STACK LASERS

(75) Inventor: Dan Botez, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 11/507,039

(22) Filed: Aug. 18, 2006

(65) Prior Publication Data
US 2008/0043794 A1  Feb. 21, 2008

(51) Int. Cl.
*H01S 5/00* (2006.01)

(52) U.S. Cl. .............. 372/45.01; 372/43.01; 372/46.01; 372/64

(58) Field of Classification Search ............ 372/45.012, 372/45.01
See application file for complete search history.

(56) References Cited

U.S. PATENT DOCUMENTS

| | | |
|---|---|---|
| 4,023,993 A | 5/1977 | Scifres et al. |
| 4,748,132 A | 5/1988 | Fukuzawa et al. |
| 4,796,274 A | 1/1989 | Akiba et al. |
| 4,802,181 A | 1/1989 | Iwata |
| 4,847,844 A | 7/1989 | Noda et al. |
| 4,894,835 A | 1/1990 | Uomi et al. |
| 4,958,357 A | 9/1990 | Kinoshita |
| 4,975,923 A | 12/1990 | Buus et al. |
| 4,983,540 A | 1/1991 | Yamaguchi et al. |
| 5,052,016 A | 9/1991 | Mahbobzadeh et al. |
| 5,086,430 A | 2/1992 | Kapon et al. |
| 5,113,072 A | 5/1992 | Yamaguchi et al. |
| 5,123,804 A | 6/1992 | Ishii et al. |
| 5,170,405 A | 12/1992 | Connolly et al. |
| 5,208,824 A | 5/1993 | Tsang |
| 5,238,531 A | 8/1993 | Macomber et al. |
| 5,241,556 A | 8/1993 | Macomber et al. |
| 5,255,278 A | 10/1993 | Yamanaka |
| 5,263,041 A | 11/1993 | Pankove |
| 5,272,714 A | 12/1993 | Chen et al. |
| 5,276,700 A | 1/1994 | Jansen et al. |
| 5,295,150 A | 3/1994 | Vangieson et al. |
| 5,323,405 A | 6/1994 | Kamivama et al. |
| 5,329,542 A | 7/1994 | Westbrook |
| 5,345,466 A | 9/1994 | Macomber |
| 5,347,533 A | 9/1994 | Higashi et al. |
| 5,432,812 A | 7/1995 | Kurobe et al. |
| 5,452,318 A | 9/1995 | Makino et al. |
| 5,536,085 A | 7/1996 | Li et al. |
| 5,606,570 A | 2/1997 | Botez et al. |

(Continued)

FOREIGN PATENT DOCUMENTS

WO   WO 01/13480   2/2001

OTHER PUBLICATIONS

Liu, One And Three-Stack Quantum Dot Lasers With Very Low Threshold Current Density, May 2000, Conference On Lasers And Electro-Optics (CLEO 2000); pp. 346-347.*

(Continued)

*Primary Examiner*—Dung T Nguyen
(74) *Attorney, Agent, or Firm*—Foley & Lardner LLP (57) ABSTRACT

The present invention provides semiconductor lasers having an Active-Photonic-Crystal (APC) structure that allows scaling of the coherent power by using a waveguide having a periodic structure that selects operation in a single spatial mode from large-aperture devices. The lasers include an active medium that includes an array of quantum box ministacks, each ministack containing 2 to 5 vertically stacked, coupled quantum boxes.

22 Claims, 10 Drawing Sheets

U.S. PATENT DOCUMENTS

| | | | |
|---|---|---|---|
| 5,617,436 | A | 4/1997 | Lo |
| 5,727,013 | A | 3/1998 | Botez et al. |
| 5,822,348 | A * | 10/1998 | Fujii ........................ 372/45.01 |
| 5,867,521 | A | 2/1999 | Macomber |
| 5,953,356 | A * | 9/1999 | Botez et al. .............. 372/45.01 |
| 6,167,073 | A | 12/2000 | Botez et al. |
| 6,195,381 | B1 | 2/2001 | Botez et al. |
| 6,330,265 | B1 | 12/2001 | Kinoshita |
| 6,643,316 | B2 | 11/2003 | Macomber |
| 6,791,104 | B2 | 9/2004 | Tansu et al. |
| 6,810,053 | B1 | 10/2004 | Botez et al. |
| 6,885,686 | B2 | 4/2005 | Botez |
| 2002/0079485 | A1 | 6/2002 | Stintz et al. |
| 2002/0196826 | A1 | 12/2002 | Mears et al. |
| 2004/0161009 | A1* | 8/2004 | Edamura et al. .............. 372/45 |
| 2005/0031002 | A1 | 2/2005 | Botez |
| 2005/0127391 | A1* | 6/2005 | Yanamoto .................... 257/103 |
| 2005/0238076 | A1 | 10/2005 | Kuwata et al. |

OTHER PUBLICATIONS

D.E. Ackley, D. Botez and B. Bogner, "Phase-Locked Injection Laser arrays with Integrated Phase Shifters", RCA Review, Dec. 1983, pp. 625-633, vol. 44.

Roel G. Baets, et al., "On the Distinctive Features of Gain Coupled DFB Lasers and DFB Lasers with Second Order Grating," IEEE Journal of Quantum Electronics, Jun. 1993, pp. 1792-1798, vol. 29, No. 6.

M. Beck, et al. "Continuous Wave Operation of a Mid-Infrared Semiconductor Laser at Room Temperature," Science, 2002, pp. 301-305, vol. 295.

Dan Botez, Luis Figueroa, "Laser-Diode Technology and Applications II", Proc. SPIE, 1990, pp. 228-232, vol. 1219.

Diode Laser Arrays (Book), Dan Botez and Dan R. Scifres, Eds., Cambridge University Press, 1994, pp. 50-53.

Botez. "High-Power Coherent, GaAs-Based Monolithic Semiconductor Lasers," Proceedings of the SPIE—The International Society for Optical Engineering SPIE-Int. Soc. Opt. Eng. USA, Nov. 2001, pp. 41-45, vol. 4533.

Botez. "Active Photonic Lattices for High-Coherent-Power Generation," Proceedings of the SPIE—The International Society for Optical Engineering SPIE-Int. Soc. Opt. Eng. USA, May 2002, pp. 233-237, vol. 4651.

Botez. "Active Photonic Lattices: Lasers for Watt-Range Coherent-Power Generation," Proceedings of the SPIE—The International Society for Optical Engineering SPIE-Int. Soc. Opt. Eng. USA, Aug. 2002, pp. 78-84, vol. 4905.

F. Capasso, et al. "Quantum Cascade Laser: A Unipolar Intersubband Semiconductor Laser," Conf. Dig. 14th IEEE International Semiconductor Laser Conference, Maui, Hi. Sep. 19-23, 1997, pp. 71-72.

Nils W. Carlson, et al. "Mode Discrimination in Distributed Feedback Grating Surface Emitting Lasers Containing a Buried Second-Order Grating," IEEE Journal of Quantum Electronics, Jun. 1991, pp. 1746-1752, vol. 27, No. 6.

Klaus David, et al. "Basic Analysis of AR-Coated, partly Gain-Coupled DFB Lasers: The Standing Wave Effect," IEEE Journal of Quantum Electronics, Nov. 4, 1996, pp. 2795-2797, vol. QE-28, No. 19.

A. Evans, et al. "Continuous-wave operation at $\lambda \sim 4.8$ µm quantum-cascade lasers at room temperature," Appl. Phys. Lett., 2004, pp. 2166-2168, vol. 85.

J. Faist, et al. "Quantum Cascade Laser," Science, 1994, pp. 553, et seq., vol. 264.

J. Faist, et al. "Vertical transition quantum cascade laser with Bragg confined excited state," Appl. Phys. Lett., 1995, 66, 538.

J. Faist, et al. "Continuous wave Quantum Cascade Lasers in the 4-10 µm wavelength region,"SPIE San Jose, Jan. 29-31, 1996, pp. 198-204, vol. 2682.

J. Faist, et al. "Room temperature mid-infrared quantum cascade lasers," Electron. Lett., Mar. 14, 1996, pp. 560-561, vol. 32, No. 6.

Charles H. Henry, et al. "Observation of Destructive Interference in the Radiation Loss of Second-Order Distributed Feedback Lasers," IEEE Journal of Quantum Electronics, Feb. 1985, pp. 151-153, vol. QE-21, No. 2.

D. Hofsteffer, et al. "Continuous wave operation of a 9.3 µm quantum cascade laser on a Peltier cooler," Appl. Phys. Lett., 2001, pp. 1964-1966, vol. 78, No. 14.

C.F. Hsu, et al. "Intersubband Laser Design using A Quantum Box Array," SPIE Proceedings 3001, Feb. 1997, pp. 1-11.

Chia-Fu Hsu, et al. "Intersubband Quantum-Box Semiconductor Lasers," IEEE Journal of Selected Topics in Quantum Electronics, May/Jun. 2000, pp. 491-503, vol. 6, No. 3.

Masoud Kasraian, et al. "Metal-grating-outcoupled, surface emitting distributed-feedback diode lasers," Appl. Phys. Lett., Nov. 4, 1996, pp. 2795-2797, vol. 69, No. 19.

Jun-Ichi Kinoshita. "Axial Profile of Grating Coupled Radiation from Second-Order DFB Lasers with Phase Shifts," IEEE Journal of Quantum Electronics, Mar. 1990, pp. 407-412, vol. 26, No. 3.

H. Kogelnik, et al. "Coupled-Wave Theory of Distributed Feedback Lasers," J. Appl. Phys., May 1972, pp. 2327-2335, vol. 43, No. 5.

Barbara Gross Levi. "Infrared Laser Demonstrates a New Principle of Operation," Physics Today, Jul. 1994, pp. 20-22.

Shuang Li and Dan Botez. "Design for High-Power Single-Mode Operation From 2-D Surface-Emitting ROW-DFB Lasers," IEEE Photonics Technology Letters, Mar. 2005, pp. 519-521, vol. 17, No. 3.

James Lopez, et al. "Uniform Near-Field, Symmetric-Mode Surface Emission from Complex-Coupled $2^{nd}$-Order Distributed-Feedback Lasers," Conference Proceedings, Leos 1997, 10th Annual Meeting, IEEE Lasers and Electro-Optics Society 1997 Annual Meeting, pp. 9-10, vol. 1.

James Lopez, et al. "Surface-emitting, distributed feedback diode lasers with uniform near-field intensity profile," Applied Physics Letters, Oct. 19, 1998, pp. 2266-2268, vol. 73, No. 16.

James Lopez, et al. "Single-mode, single-lobe operation of surface-emitting, second-order distributed feedback lasers," Applied Physics Letters, AIP, USA, Aug. 16, 1999, pp. 885-887, vol. 75, No. 7.

Steven H. Macomber. "Nonlinear Analysis of Surface-Emitting Distributed Feedback Lasers," IEEE Journal of Quantum Electronics, Dec. 1990, pp. 2065-2073, vol. 26, No. 12.

Steven H. Macomber, et al. "Curved-Grating, Surface-Emitting DFB Lasers and Arrays," Proc. SPIE, 1997, pp. 42-54, vol. 3001, No. 42.

Steven H. Macomber. "Design of High-Power, Surface-Emitting DFB Lasers for Suppression of Filamentation," Proc. SPIE, 2003, pp. 37-49, vol. 4993.

M. Matsumoto, et al. "Single-lobed far-field pattern operation in a phased array with an integrated phase shifter," Appl. Phys. Lett., Jun. 1, 1987, pp. 1541-1543, vol. 50, No. 22.

Luke J. Mawst, et al. "Two-Dimensional surface-Emitting Leaky-Wave Coupled Laser Arrays," IEEE Journal of Quantum Electronics, Jun. 1993, pp. 1906-1917, vol. 29, No. 6.

Jasprit Singh. "Possibility of Room Temperature Intra-Band Lasing in Quantum Dot Structures Placed in High-Photon Density Cavities," IEEE Photonics Technology Letters, Apr. 1996, pp. 488-490, vol. 8, No. 4.

Ned S. Wingreen, et al. "Quantum-Dot Cascade Laser: Proposal for an Ultralow-Threshold Semiconductor Laser," IEEE Journal of Quantum Electronics, vol. 33, No. 7, Jul. 1997, pp. 1170-1173.

G. Witjaksono, et al. "Single-lobe, Orthonormal-Beam Surface Emission from $2^{nd}$-Order DFB/DBR Lasers with Half-Wave Grating Phaseshift," Paper No. ThC4, Conference Digest, 2002 IEEE 18th International Semiconductor Laser Conference, Garmisch, Germany, Sep. 29-Oct. 3, 2002, pp. 165-166.

B. Xu, et al. "Grating Coupling for Intersubband Emission," Applied Physics Letters, US, American Institute of Physics, New York, May 12, 1997, pp. 2511-2513, vol. 70, No. 19.

S.F. Yu, et al. "Effect of External Reflectors on Radiation Profile of Grating Coupled Surface Emitting Lasers," IEE Proceedings J. Optoelectronics, GB, Institution of Electrical Engineers, Stevenage, Feb. 1, 1993, pp. 30-38, vol. 140, No. 1.

* cited by examiner

| Layer | Ga* or As** Fraction | Thickness (Å) |
|---|---|---|
| GaAs | 1 | 50 |
| GaAsP | 0.62 | 35 |
| GaAs | 1 | 42 |
| AlGaAs | 0.3 | 15 |
| GaAs | 1 | 47 |
| AlGaAs | 0.3 | 15 |
| GaAs | 1 | 40 |
| AlGaAs | 0.3 | 16 |
| GaAs | 1 | 30 |
| GaAsP | 0.62 | 40 |
| AlGaAs | 0.3 | 20 |
| GaAs | 1 | 28 |
| InGaAs | 0.6 | 30 |
| AlGaAs | 0.3 | 13 |
| InGaAs | 0.6 | 36 |
| AlGaAs | 0.3 | 20 |
| InGaAs | 0.7 | 22 |
| GaAsP | 0.5 | 20 |
| InGaAs | 0.7 | 20 |
| GaAsP | 0.5 | 20 |
| InGaAs | 0.7 | 19 |
| GaAsP | 0.5 | 20 |
| InGaAs | 0.7 | 19 |
| GaAsP | 0.5 | 20 |
| InGaAs | 0.7 | 18 |
| GaAsP | 0.5 | 20 |

\* If the compound is $Al_{1-x}Ga_xAs$ or $In_{1-x}Ga_xAs$
\*\* If the compound is $GaAs_xP_{1-x}$

INTERSUBBAND QUANTUM BOX STACK LASERS

STATEMENT OF GOVERNMENT RIGHTS

Research funding was provided for this invention by the National Science Foundation under grant No. NSF: 0200321. The United States government has certain rights in this invention.

FIELD OF THE INVENTION

This invention relates to semiconductor lasers incorporating arrays of stacked quantum boxes in an active photonic crystal structure.

BACKGROUND OF THE INVENTION

Semiconductor lasers are formed of multiple layers of semiconductor materials. The conventional semiconductor diode laser typically includes an n-type layer, a p-type layer and an undoped layered active structure between them such that when the diode is forward biased electrons and holes recombine within the active structure with the resulting emission of light. The layers adjacent to the active structure typically have a lower index of refraction than the active structure and form cladding layers that confine the emitted light to the active structure and sometimes to adjacent layers. Semiconductor lasers may be constructed to be either edge emitting or surface emitting.

A semiconductor laser that emits photons as electrons from within a given energy band cascade down from one energy level to another, rather than emitting photons from the recombination of electrons and holes, has been reported by a group at AT&T Bell Laboratories. See, J. Faist, F. Capasso, D. L. Sivco, C. Sirtori, A. L. Hutchinson, and A. Y. Cho, Science, Vol. 264, pp. 553, et seq., 1994. This device, referred to as a quantum cascade laser (QCL), is the first reported implementation of an intersubband semiconductor laser. The basic light-generation mechanism for this device involves the use of 25 active regions composed of 3 quantum wells each. Injection by resonant tunneling occurs in the energy level (level 3) of the first, narrow quantum well. A radiative transition occurs from level 3, in the first well, to level 2, the upper state of the doublet made by two coupled quantum wells. Quick phonon-assisted relaxation from level 2 to 1 insures that level 2 is depleted so that population inversion between levels 3 and 2 can be maintained. Electrons from level 1 then tunnel through the passive region between active regions, which is designed such that, under bias, it allows such tunneling to act as injection into the next active region.

Lasing for such devices has been reported at 4.6 µm up to 125 K with threshold-current densities in the 5 to 10 kA/cm$^2$ range. F. Capasso, J. Faist, D. L. Sivco, C. Sirtori, A. L. Hutchinson, S. N. G. Chu, and A. Y. Cho, Conf. Dig. 14th IEEE International Semiconductor Laser Conference, pp. 71-72, Maui, Hi. (Sep. 19-23, 1994). While achieving intersubband lasing in the mid- to far-infrared region, the thresholds were two orders of magnitude higher than "state-of-the-art" practical diode lasers. The reason for the high thresholds is that the transition from level 3 to 2 is primarily nonradiative. The radiative transition, with momentum conservation, has a lifetime, $T_R$, of about 26 ns, mostly due to the fact that it involves tunneling through the barrier between the first and second quantum well. By contrast, the phonon-assisted transition, $T_{32}$, has a relatively short lifetime, i.e., $T_{32} \cong $ ≃4.3 ps. As a result, phonon-assisted transitions were about 6000 times more probable than photon-assisted transitions; that is, the radiative efficiency was 1.6×10$^{-4}$, which explains the rather high thresholds.

Faist, et al. proceeded to improve their QCL device by making two-well active regions with a vertical transition in the first well, and providing a multi-quantum barrier (MQB) electron reflector/transmitter (mirror). J. Faist, F. Capasso, C. Sirtori, D. L. Sivco, A. L. Hutchinson, and A. Y. Cho, Appl. Phys. Lett., 66, 538, (1995). As a result, the electron confinement to level 3 improved (i.e., the reflection aspect of the MQB mirror suppresses electron escape to the continuum), and threshold current densities, $J_{th}$, as low as 1.7 kA/cm$^2$ at 10 K were achieved. However, the basic limitation, low radiative efficiency, was not improved, since phonons still dominate the level 3 to level 2 transition. Using a 2 QW active region with a vertical transition in the first well, $J_{th}$ values as low as 6 kA/cm$^2$ at 220 K were obtained. J. Faist, F. Capasso, C. Sirtori, D. L. Sivco, A. L. Hutchinson, S. N. G. Chu, and A. Y. Cho, "Continuous wave quantum cascade lasers in the 4-10 µm wavelength region," SPIE vol. 2682, San Jose, pp. 198-204, 1996. An improved version of the vertical transition design was operated pulsed at 300 K, the first mid-IR laser to operate at room temperature in the 5 µm wavelength regime. J. Faist, F. Capasso, D. L. Sivco, C. Sirtori, A. L. Hutchinson, and A. Y. Cho, "Room temperature mid-infrared quantum cascade lasers," Electron. Lett., vol. 32 pp. 560-561, 1996. A further improvement consisted of using three QWs such that the lower energy level (of the optical transition) is depopulated by using phonon-assisted transitions to two lower levels. D. Hofstetter, M. Beck, T. Aellen, J. Faist et al., "Continuous wave operation of a 9.3 µm quantum cascade laser on a Peltier cooler", Appl. Phys. Lett., vol. 78, pp 1964-1966, 2001. This double-phonon resonance approach has allowed lowering the $J_{th}$ value to 3-4 kA/cm$^2$ and resulted in the first continuous wave (CW) room-temperature operation of QC lasers ($\lambda$=9.1 µm). M. Beck, D. Hofstetter, T. Aellen, J. Faist, U. Oesterle, M. Ilegems, E. Gini, and H. Melchior, "Continuous Wave Operation of a Mid-Infrared Semiconductor Laser at Room Temperature," Science, vol. 295, pp. 301-305, 2002. However, that was achieved with very low wallplug efficiency, $\eta_p$, values (<1%) and highly temperature-sensitive characteristics. Recently, strain-compensated structures have allowed CW operation at room temperature at shorter wavelengths ($\lambda$=4.3-6.0 µm), but again with low $\eta_p$ values (<3%) and highly temperature-sensitive CW characteristics. A. Evans, J. S. Yu, S. Slivken, and M. Razeghi, "Continuous-wave operation at $\lambda$~4.8 µm quantum-cascade lasers at room temperature," Appl. Phys. Lett., vol. 85, pp. 2166-2168, 2004. This poor performance is directly related to the fact that the rise in the active-region temperature with respect to the heatsink temperature is very high (e.g., 70-80° C.), about an order of magnitude higher than for conventional semiconductor lasers. That is why for most effective all-around heat removal a buried heterostructure is needed since the generated heat can be laterally removed.

Botez et al. have proposed the use of 2-D arrays of quantum boxes for increasing the carrier relaxation time by at least a factor of 20. U.S. Pat. No. 5,953,356. Then. $\eta_p$ values as high as 24% have been predicted. Chia-Fu Hsu, Jeong-Seok O, Peter Zory and Dan Botez, "Intersubband quantum-box semiconductor lasers," IEEE J. Selected Topics in Quantum Electronics, vol. 6, pp. 491-503, May/June 2000. However, due to relatively low gain, such devices will provide low powers (~30 mW) from conventional single-element devices. Although it has not previously been suggested, one possibility for increasing the emitted power, is scaling in the lateral direction via Active-Photonic-Crystal (APC) structures.

Since QCLs may utilize a buried heterostructure design in order to assist with lateral heat removal, it is impractical to incorporated such lasers into APC structures for scaling the power, as it is done for other types of lasers.

SUMMARY OF THE INVENTION

In accordance with the present invention, semiconductor lasers are formed to provide highly efficient emission at selected wavelengths, which may lie in the mid- to far-infrared range. For example, the lasers may be designed to emit in the 3-5 μm range, or in the 8 to 12 μm range. The semiconductor lasers include an active medium (or "core") that includes an array of quantum box ministacks separated by a matrix of current blocking material, which may be a semi-insulating semiconductor. The core of semiconductor lasers of the present invention is incorporated into a periodic dielectric structure with modulated optical gain, known as an active photonic crystal (APC), to realize watt-range coherent, edge-emitted powers from the devices. In contrast to conventional APCs, the devices in accordance with this invention have gain in the low-index regions of the APC, enabling long-range (coherent) coupling by traveling waves utilizing resonant leaky-wave coupling between the low-index regions.

The present semiconductor lasers are constructed to emit in the infrared range and to provide efficient conversion of electrical energy to electromagnetic energy at infrared wavelengths, and thus may be used as compact, efficient infrared sources for a variety of applications, such as spectrometry, measurement of gases and liquids for process control and pollution monitoring, infrared signaling, and the like.

Each quantum box in a ministack is formed of multiple layers of semiconductor material which provide an electron injector, an active region coupled to the electron injector, and an electron reflector coupled to the active region, opposite the electron injector. A description of quantum boxes of the type that may be used in the present semiconductor lasers is provided in U.S. Pat. No. 5,953,356. As used herein, the phrase "coupled to" is used broadly to indicate that at least some electrons are able to pass from one section (e.g., electron injector, active region or electron reflector) of the structure to another. In some instances the coupled sections will be directly adjacent. Some electrons injected from the injector into the active region at a high energy level make a transition to a lower energy level with the emission of a photon. The electron reflector may be comprised of multiple semiconductor layers which are formed to have a minigap with a low transmission at the energy level of the high-energy electrons injected into the active region to reflect such electrons back into the active region, and a miniband with a high transmission at the energy level of the lower-energy electrons.

Within the core of the semiconductor lasers, the quantum boxes are vertically stacked in ministacks containing 2 to 5 quantum boxes each, and the ministacks are arranged in a two-dimensional (2D) array. A current-blocking semiconductor material deposited between the quantum box ministacks confines the current to the ministacks. By coupling a few quantum boxes in each ministack, the present semiconductor lasers are able to provide a higher gain and, therefore, more power than semiconductor lasers having an active medium composed of an array of individual quantum boxes, such as those described in U.S. Pat. No. 5,953,356. The improved radiative efficiency of the quantum box stack lasers results in a low threshold-current density for lasing action as well as high wallplug efficiency, which are required for a commercially practical laser.

The quantum wells in the active region of the quantum boxes are desirably "deep" quantum wells, where a deep quantum well is defined as a quantum well having a well bottom that is lower in energy than the bottoms of the quantum wells in the adjacent electron injector. The quantum wells of the active region and/or the injection barrier of the electron injector may be composite structures. For example, a composite injector barrier layer may comprise two semiconductor layers, the second semiconductor layer having a higher bandgap than the first, and the second semiconductor layer of the composite injector barrier being sufficiently thin to prevent scattering to the X valleys during tunneling. A composite quantum well may comprise two adjacent semiconductor well layers, the second semiconductor well layer providing a deeper well than the first.

By way of illustration only, an active region in a quantum box may include two deep quantum wells formed of well layers of InGaAs disposed between barrier layers of AlGaAs. The first of the two quantum wells is desirably a composite quantum well composed of a layer of GaAs adjacent to a layer of InGaAs. The electron injector may be formed of a superlattice of alternating layers of GaAs and AlGaAs, and the reflector may be formed of a superlattice of alternating layers of GaAsP and InGaAs. In this embodiment, the injector barrier adjacent to the active region is desirably a composite barrier composed of a layer of GaAsP adjacent to a layer of AlGaAs. The current blocking material in the active structure surrounding and separating the quantum boxes may be semi-insulating (SI) GaAs.

The quantum boxes within each ministack are coupled such that electrons exiting the electron reflector of one quantum box pass into the electron injector of a neighboring quantum box. For typical semiconductor material systems, the quantum boxes will have lateral dimensions less than 1000 angstroms and preferably less than about 600 angstroms. The quantum box ministacks are desirably arranged in a uniform 2D array with a spacing between adjacent ministacks of less than 1000 angstroms and preferably less than about 600 angstroms.

The core of the semiconductor lasers is enclosed in a laterally periodic waveguide that creates an active photonic crystal (APC) type structure. The waveguide may include various layers on each side of the core to provide conduction across the active region, and optical confinement and cladding layers to provide confinement of the photons generated in the active region. Electrodes may be formed on the top and bottom surfaces of the APC structure to allow connection to an external circuit to provide current flow across the structure.

The laterally periodic waveguide may be created due to periodic variations in the thicknesses of one optical confinement layer and one cladding layer adjacent to the optical confinement layer which in turn lead to alternating low-effective-index and high-effective-index regions in the waveguide, whereby the low-effective-index regions define laser device elements and the high-effective-index regions define interelement regions, whereby modal gain is preferentially enhanced in the laser device elements, thereby insuring that only the APC-structure modes peaked in those regions can lase and allowing for long range coherent coupling via traveling waves.

In one embodiment based on a GaAs material system, the waveguide may include optical confinement layers of n-GaAs adjacent to the laser core and outer cladding layers of $n^+$-GaAs. The waveguide may optionally also include additional cladding layers, such as an AlGaAs and/or InGaAs layers to improve confinement.

As described above, the semiconductor lasers of the invention can be formed of material systems, and on substrates, such as gallium arsenide (GaAs), that are compatible with further semiconductor circuit processing. A variety of material systems in addition to GaAs, such an indium phosphide (InP), may also be utilized which can similarly be formed to have appropriate intersubband transitions.

The semiconductor lasers of the invention are also well suited to being produced using production techniques compatible with a large scale processing, such as metal-organic chemical vapor deposition (MOCVD).

Further objects, features and advantages of the invention will be apparent from the following detailed description when taken in conjunction with the accompanying drawings.

DETAILED DESCRIPTION OF THE INVENTION

The present invention provides semiconductor lasers having an APC structure that allows scaling of the coherent power by using a waveguide having a periodic structure that selects operation in a single spatial mode from large-aperture devices. The lasers include an active medium that includes an array of quantum box ministacks, each ministack containing 2 to 5 vertically stacked, coupled quantum boxes.

The present lasers are capable of providing an output power of at least about 0.5 Watts (W). This includes embodiments that provide an output power of at least about 1 W, further includes embodiments that provide an output power of at least about 5 W and still further includes embodiments that provide an output power of at least about 10 W. The lasers are also capable of providing a wallplug efficiency of at least about 30%, and may operate at low temperatures (e.g., room temperature (~30° C.) operation). In some embodiments the lasers have a wallplug efficiency of at least about 40% and in some embodiments the lasers have a wallplug efficiency of at least about 50%.

The semiconductor lasers are well-suited for use in a variety of applications including, but not limited to, laser-based radar, free-space optical communication links, infrared imaging, infrared countermeasures against heat-seeking missiles, multi-spectral sensing of remote objects, deceptive radar jamming, high-sensitivity chemical/biological agent detection, amplifiers, medical imaging, spectrometry and gas sensing.

The active medium of the semiconductor lasers utilizes suppression of phonon-assisted energy relaxation processes to provide an efficient, low threshold and, thus, practical, intersubband laser. Suppression of phonon-assisted transitions is achieved in the present invention by utilizing appropriate quantum box stack structures in the core of the laser structure.

Figure 1:
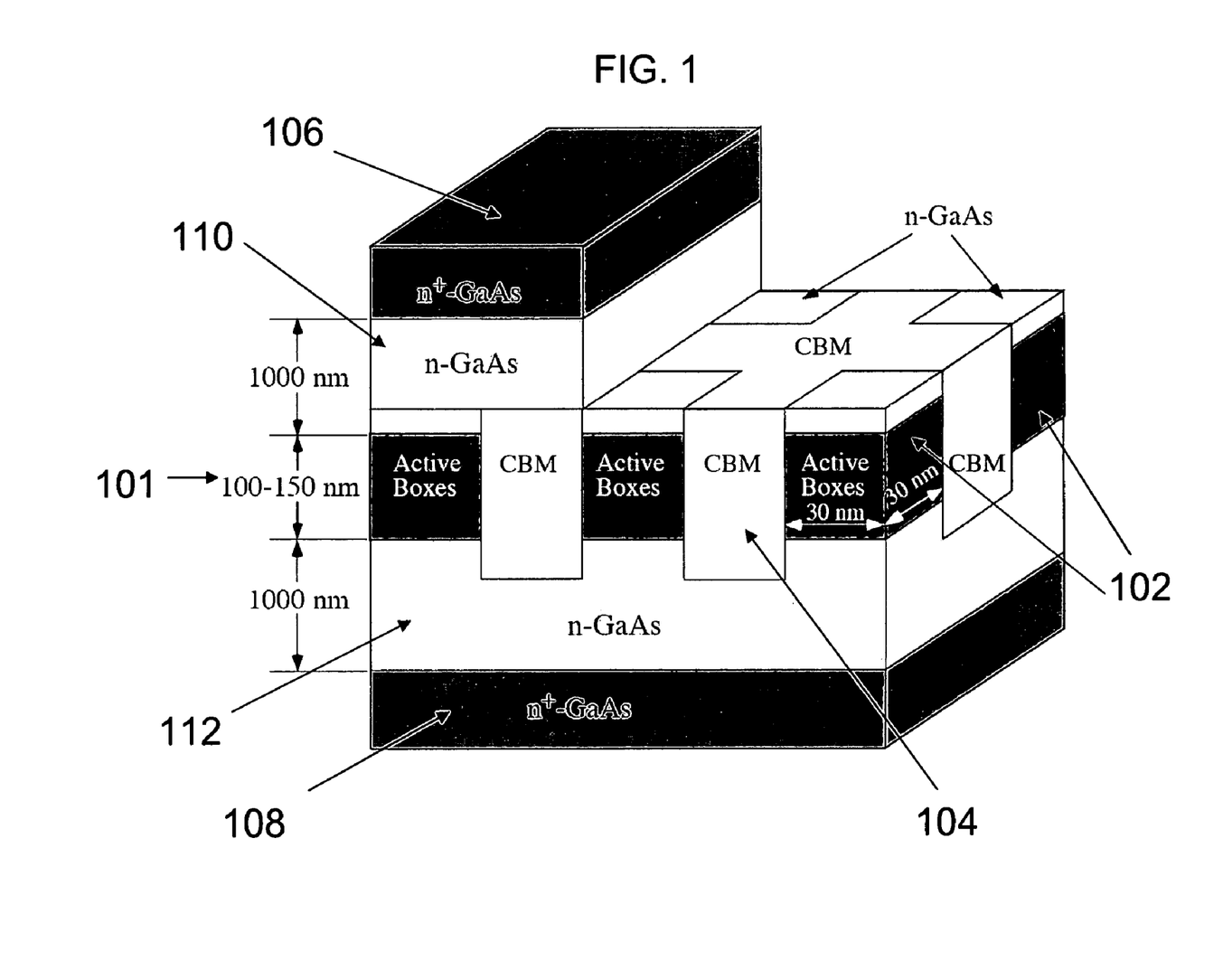
FIG. 1 shows an implementation of a semiconductor quantum box stack laser in accordance with the present invention.

With reference to the drawings, an example of an implementation of a laser of the present invention is illustrated generally in FIG. 1. The device includes a laser core 101 composed of a 2D array of quantum-box (QB) ministacks 102, separated by a matrix of current-blocking material (CBM) 104. Each ministack is composed of 2 to 5 (desirably 2-3) vertically stacked, coupled quantum boxes. In the portion of the laser shown in FIG. 1 (which represents a laser device element), the structure further includes a waveguide made from top and bottom cladding layers 106 and 108, respectively. Adjacent cladding layers 106 and 108 are top and bottom optical confinement layers 110 and 112, respectively, which are selected to provide appropriate electrical conduction across them and to have an appropriate index of refraction so as to cooperate with the cladding layers 106 and 108 to provide optical confinement of the emitted light to the region between the layers 106 and 108. For example, where the outer layers 106 and 108 are formed of heavily doped n-type GaAs ($n^+$-GaAs), the optical confinement layers 110 and 112 may be formed of lightly doped n-type GaAs (n-GaAs). For the material system discussed above, the current blocking material may comprise semi-insulating GaAs. The current blocking material desirably entirely surround the quantum box ministacks within the core of the laser to electrically and physically isolate the ministacks from one another. Because the current blocking material is semi-insulating, current flowing across the multilayer semiconductor structure between electrodes will be confined to flow through the quantum box ministacks rather than through the semi-insulating material, thereby enhancing the efficiency of utilization of the current flowing between the electrodes.

Figure 2A:
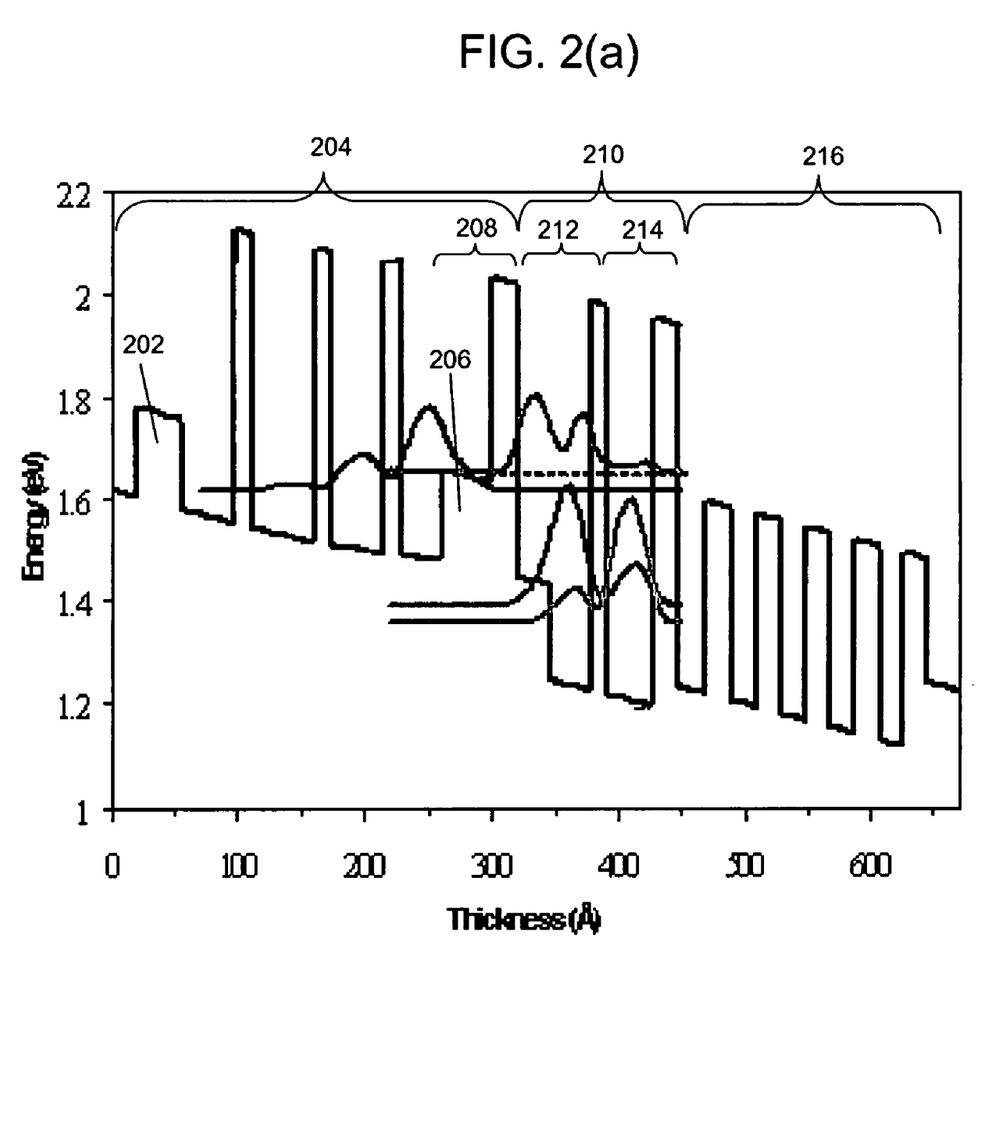
FIG. 2(a) shows a conduction band energy diagram for a multilayered semiconductor structure of a single quantum box that may be incorporated into a quantum box stack laser.
Figure 2B:
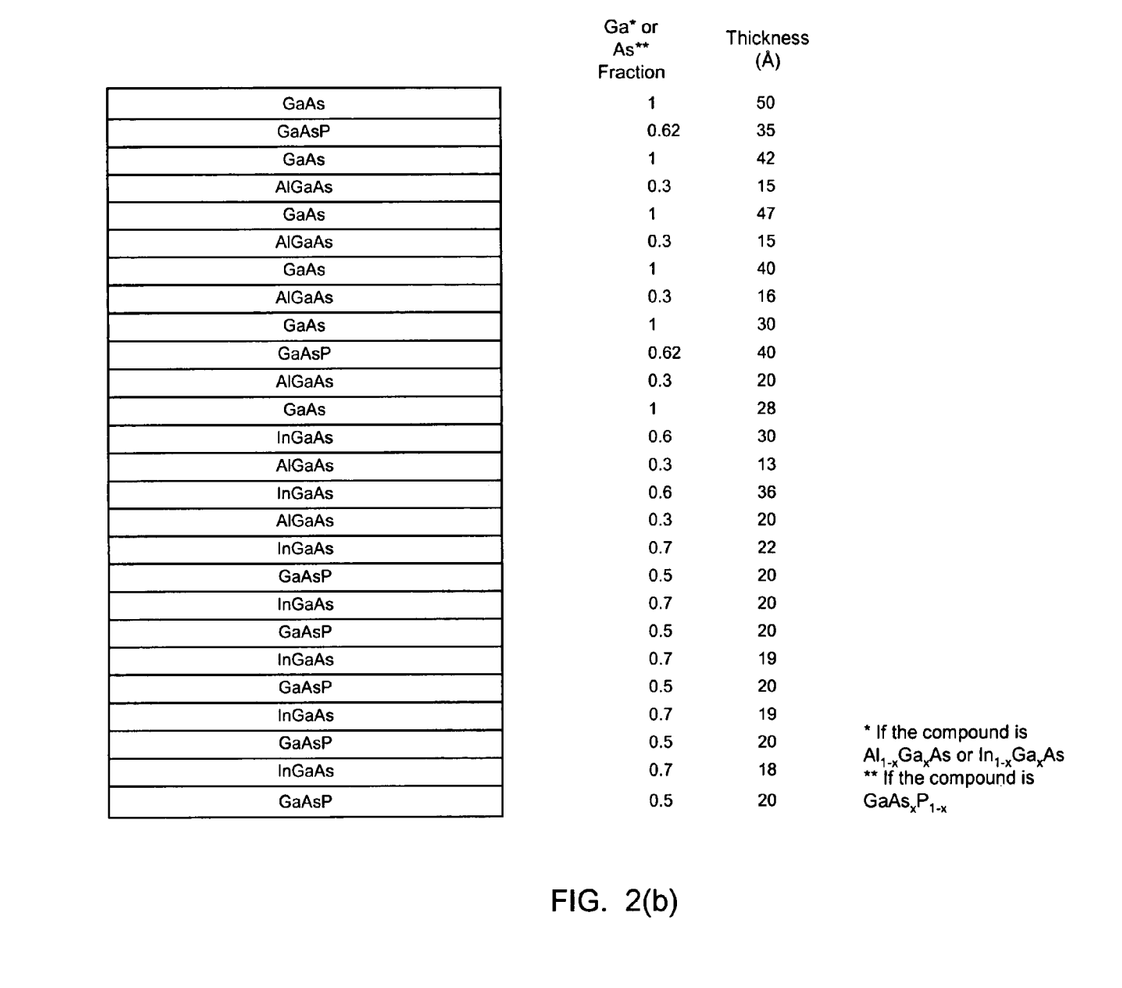
FIG. 2(b) shows illustrative compositions and thicknesses for each layer represented in the conduction band energy diagram of FIG. 2(a).

FIG. 2(a) shows the conduction band energy diagram for the multilayered semiconductor structure of a single quantum box that may be incorporated into a quantum box ministack for the material system discussed above. In the structure of FIG. 2(a) strain compensation is provided by using a tensilely-strained layer 202 as the first barrier layer of the electron injector 204 along with a tensilely-strained layer 206 as the first layer of the composite injection barrier 208. Tensilely-strained layer 206 acts as an intermediate height barrier layer that decouples the wavefunctions of the ground state of the electron injector miniband and a lower energy level of the active region, but still allows good coupling between the ground state of the electron injector miniband and an upper energy level of the active region. In the particular embodiment shown in FIG. 2, tensilely-strained layers 202 and 206 are $GaAs_{0.62}P_{0.38}$ layers, and the other layers making up electron injector 204 are alternating layer of GaAs and $Al_{0.7}Ga_{0.3}As$. The active region 210 is composed of a first composite quantum well 212 having a GaAs layer adjacent to a $In_{0.4}Ga_{0.6}As$ layer and a second quantum well 214 of $In_{0.4}Ga_{0.6}As$ sandwiched between layers of $Al_{0.7}Ga_{0.3}As$. The electron reflector 216 is a superlattice of alternating layers of $In_{0.3}Ga_{0.7}As$ and $GaAs_{0.5}P_{0.5}$. The table in FIG. 2(b) shows the composition and thickness of each layer represented in the conduction band energy diagram of FIG. 2(a). In the table, the middle column indicates the Ga fraction for $Al_{1-x}Ga_xAs$ or $In_{1-x}Ga_xAs$ or the As fraction for $GaAs_xP_{1-x}$. The far right column in the tables provides the thickness (in Å) of each layer. It is noted that, for the structure of FIG. 2, utilizing the deep-well configuration allows the electron injector to be optimized independently of the reflector.

Figure 3:
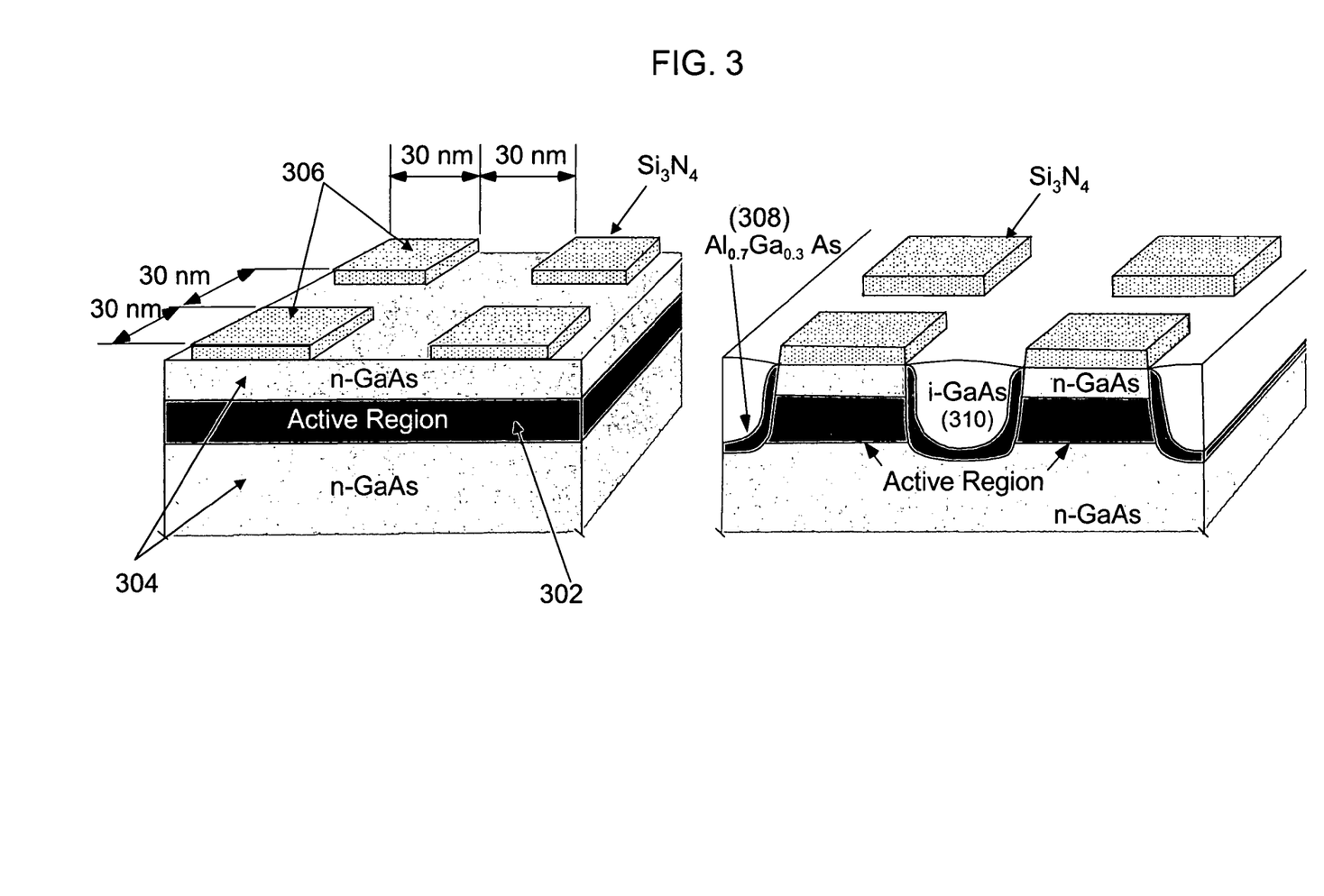
FIG. 3 is a schematic illustration of a fabrication scheme for fabricating an active medium in accordance with the present invention.

The semiconductor structures of FIGS. 1 and 2 may be produced by conventional semiconductor processing techniques, and do not require the use of molecular beam epitaxy for implementation. The basic fabrication scheme for fabricating an active medium is illustrated in FIG. 3. Using MOCVD growth, a multilayered semiconductor structure 302 is grown, wherein the structure includes the various semiconductor layers that make up the quantum boxes in the ministacks (e.g., as shown in FIG. 2) sandwiched between two semiconductor layers 304 (e.g., n-GaAs), the structure is then covered with a thin (~40 nm) dielectric film 306 (e.g., $Si_3N_4$) and, after an e-beam resist is deposited, exposed to an electron beam and developed, the ministack-pattern is defined. Then RIE is used to transfer the pattern into the dielectric layer 306. Enough of the exposed multilayered semiconductor structure is then removed to provide an array of ministacks and a current blocking material is then re-grown between the ministacks to provide a 2D array of ministacks in a matrix of current blocking material. For example, approximately 100-150 nm of the multilayered semiconductor material (i.e., enough to contain two to three quantum boxes) may be removed by, for example, $BCl_3$-based, dry-plasma etching, followed by in situ gas etching and regrowth of current blocking materials in an MOCVD system. The current blocking material that is regrown between the ministacks may include n-GaAs (for Fermi level pinning), n-$Al_{0.7}Ga_{0.3}As$ 308 (to prevent lateral carrier leakage) and/or semi-insulating (SI) GaAs 310 (for current confinement to the quantum boxes). After removing the $Si_3N_4$ mask 306, the n-GaAs layer 110 may be regrown over the top of the 2D array.

The growth of the current-blocking material may be accomplished through the following process. First, the in situ etched surfaces of the multilayered semiconductor structure will serve as the growth front for the growth of thin layers of n-GaAs (not shown in FIG. 3) and n-$Al_{0.7}Ga_{0.3}As$. This initial AlGaAs layer will serve as the surface for the growth of SI GaAs. Controlled oxygen addition leads to the introduction of multiple deep levels, with a dominant state lying near mid-gap in GaAs, (as described in Frankel et al., Appl. Phys. Lett., 66, pp. 634-636 (1995) and Huang et al., J. Electron. Mater., 23, pp. 659-667 (1994)) and in AlGaAs (as described in Huang et al., J. Electron. Mater., 23, pp. 659-667 (1994)). Using an oxygen-doping source oxygen-related defects may be incorporated during growth. Using these growth techniques, SI GaAs may be grown with bulk resistivity $>6\times10^9$ $\Omega$cm at room temperature. The selective-area growth of n-$Al_xGa_{1-x}As$ and GaAs layers when using $SiO_2$ or $Si_3N_4$ mask may also be carried out using conventional methyl-based precursors as well as diethyl gallium chloride.

The ministacks desirably include 2 to 5 vertically stacked quantum boxes. In some preferred embodiments the ministacks include 2 quantum boxes, 3 quantum boxes or 4 quantum boxes. Thus, the height of each ministack in the 2D array is generally at least about 100 nm, typically about 100 nm to 300 nm, desirably about 100 nm to 200 nm and more desirably about 100 nm to 150 nm. The ministacks typically have lateral cross-sectional dimensions (e.g., diameters) of no more than about 100 nm (desirably about 10 to 50 nm, more desirably about 20 to 30 nm) and are generally separated by a distance of no more than about 100 nm, desirably no more than about a ministack diameter.

Because the area of core region may be large (e.g., ~0.25 $mm^2$) e-beam lithography may be undesirable for quantum box patterning. Therefore, block copolymer lithography, as described in Cheng et al., Advanced Materials, 13, pp. 1174-11-78 (2001) and Xiao et al., 16, Nanotechnology, p.S324 (2005), may be used instead. Using this technique larger device areas may be patterned with quantum box ministacks. For example, using block copolymer lithography, 20 nm-disks on ~40 nm centers become possible.

Figure 4:
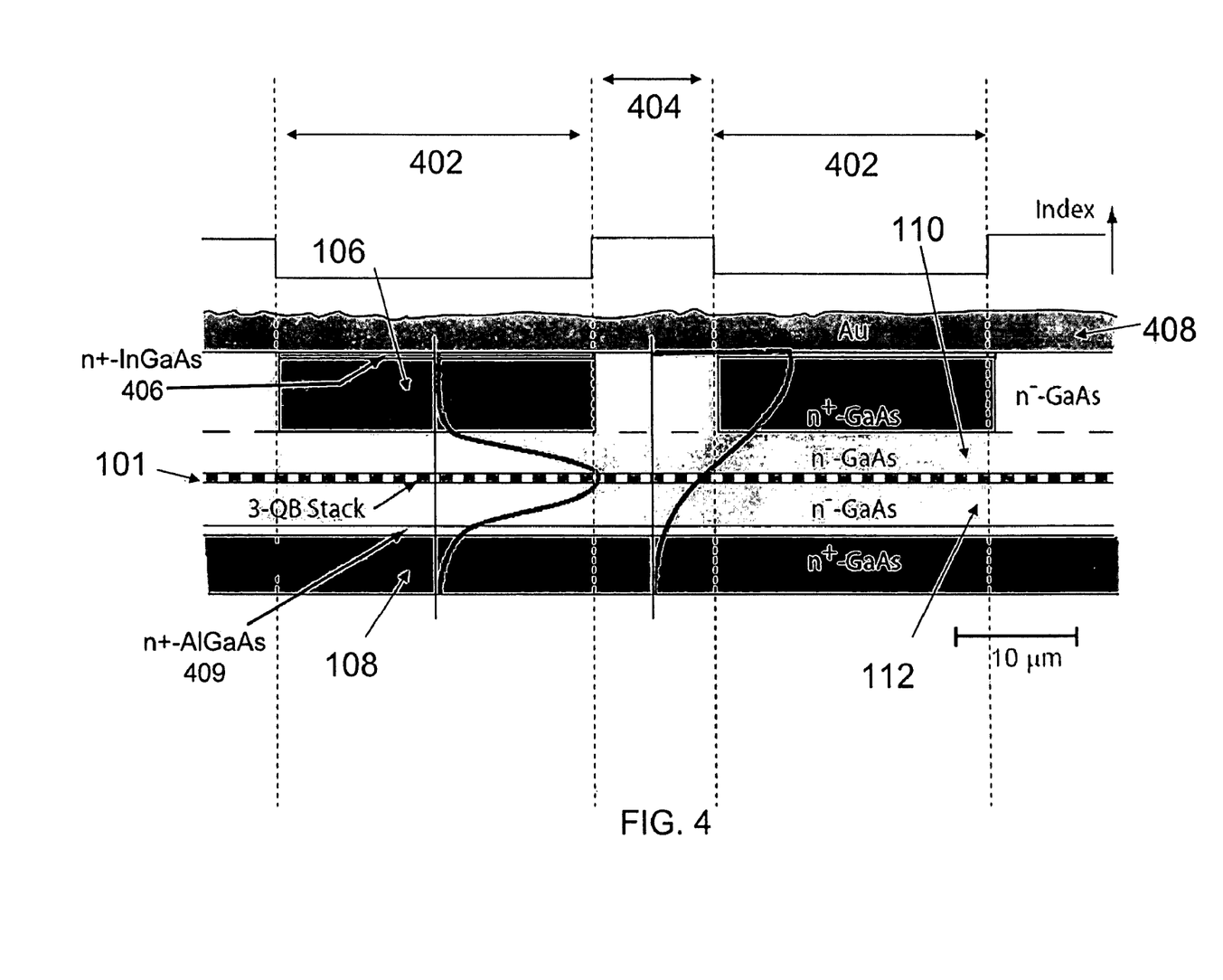
FIG. 4 shows an illustrative active photonic crystal laser device structure.

In order to increase the output power of the intersubband quantum-box stack semiconductor lasers, the active medium, including the quantum box ministacks in the current blocking material matrix is sandwiched between the layers of a waveguide that includes a periodic dielectric structure which provides an APC structure. For purposes of illustrating the invention, an illustrative APC structure is shown in FIG. 4. This structure includes a plurality of laser device elements 402 separated by interelement regions 404. The laser device elements are defined by laterally-spaced regions of lower effective refractive index and the interelement regions are defined by laterally-spaced regions of higher effective refractive index. The device elements and interelement regions are created by periodic variations in the thickness of an optical confinement layer and its adjacent cladding layer. The lateral dimensions of the lower effective index regions and the higher effective index regions are typically about 5 to 50 µm, with the higher effective index regions having smaller lateral dimensions. The index steps between the laser device elements and the interelement regions are desirably relatively large (e.g., $\Delta n \cong 0.05$) to ensure optical mode stability against carrier and thermally induced dielectric constant variations.

Figure 5:
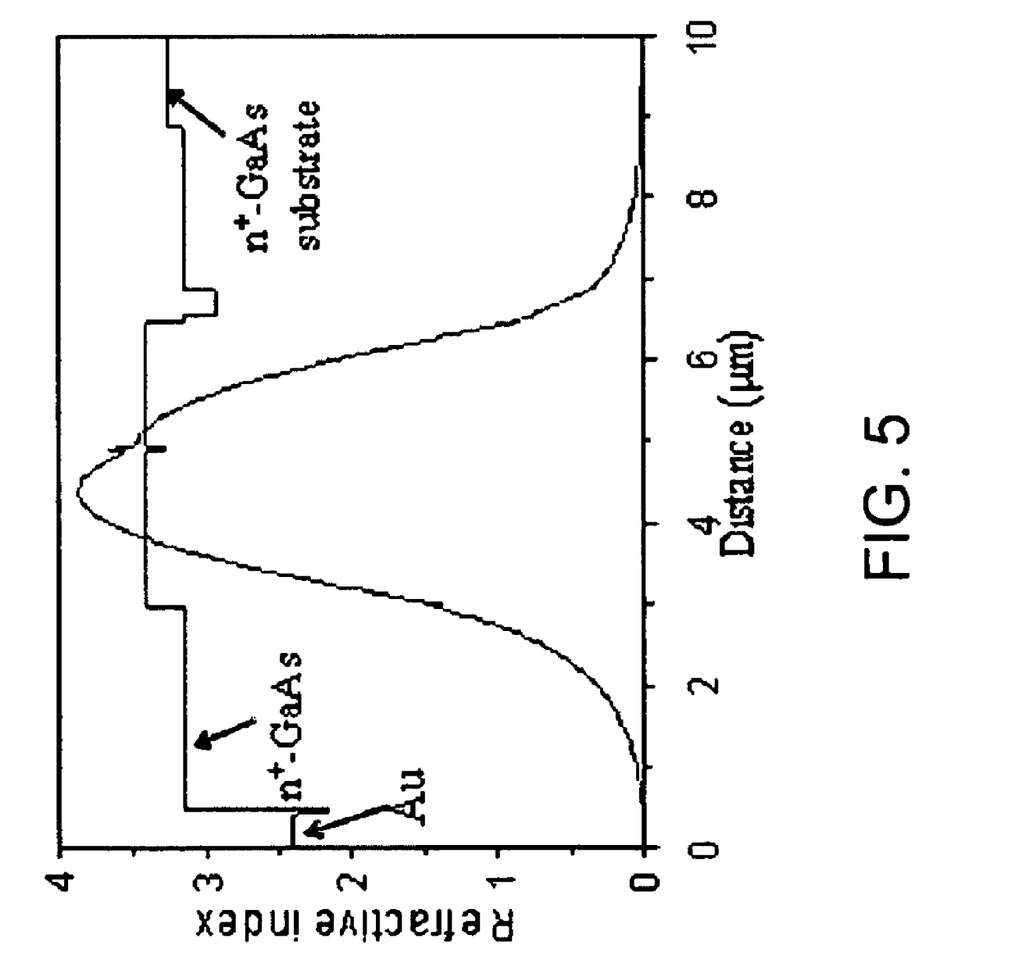
FIG. 5 shows the optical intensity profile and refractive index profile of a laser device element.
Figure 6:
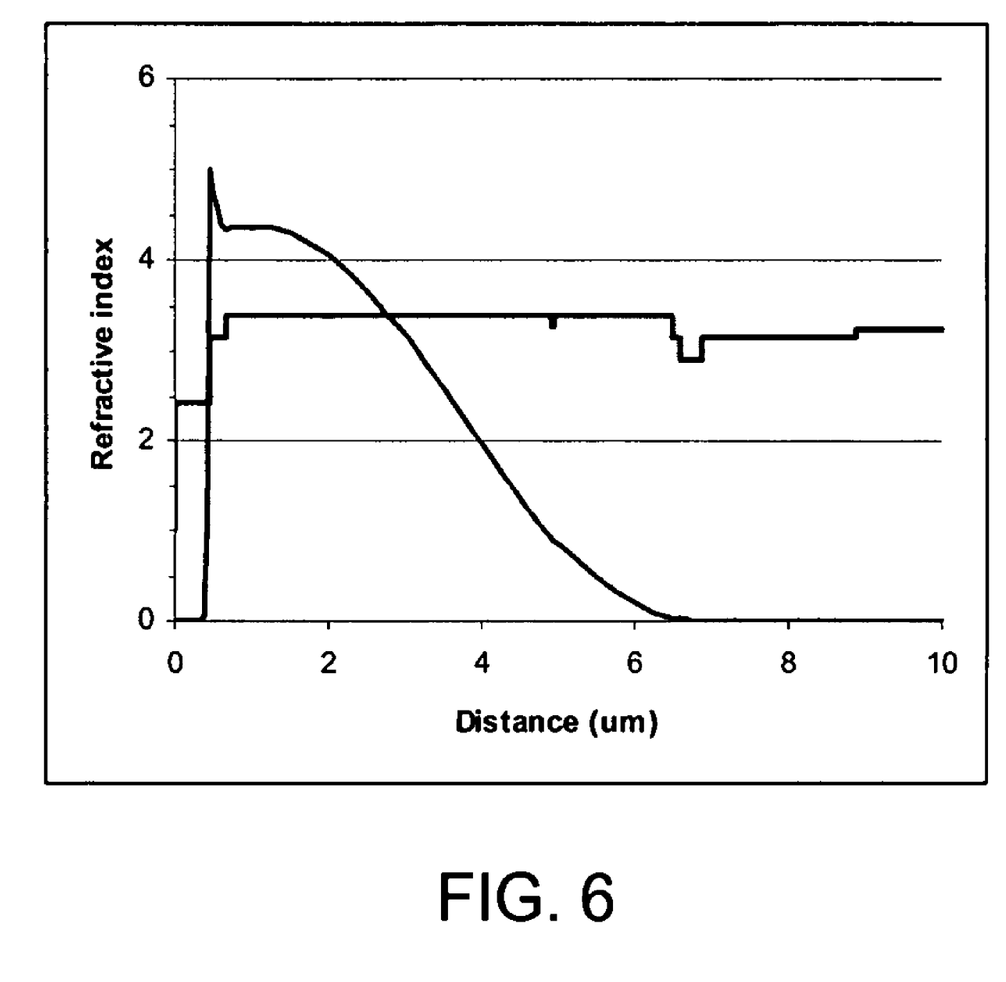
FIG. 6 shows the optical intensity profile and refractive index profile of an interelement region.
Figure 7:
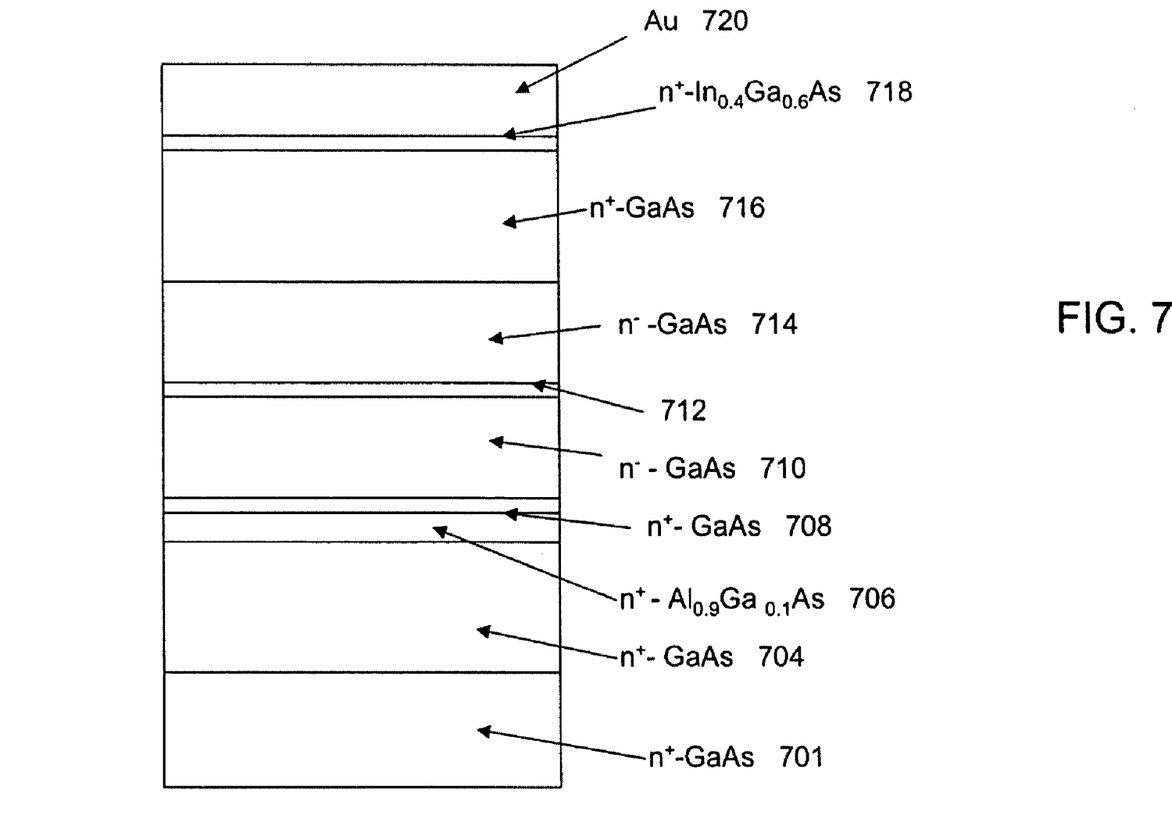
FIG. 7 shows illustrative compositions, thicknesses and doping levels for the various layers of the laser device element of FIG. 5.
Figure 8:
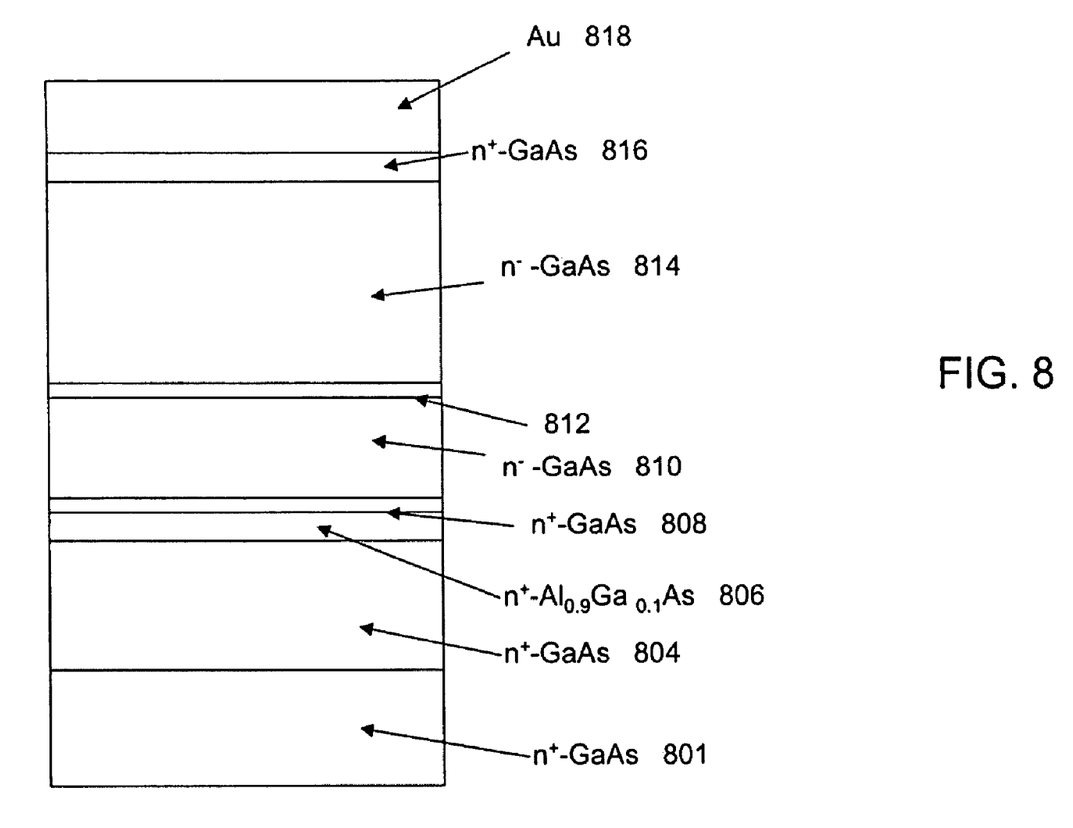
FIG. 8 shows illustrative compositions, thicknesses and doping levels for the various layers of the interelement region of FIG. 6.

FIG. 5 shows the optical intensity profile and refractive index profile of a laser device element grown on a GaAs substrate. FIG. 6 shows the optical intensity profile and refractive index profile of an interelement region. Suitable compositions, thicknesses and doping levels (where applicable) for the various layers shown in FIGS. 5 and 6 are shown in FIGS. 7 and 8. The structure of FIG. 7 includes a layer of n+-GaAs 701, an active medium 712, and a layer of Au 720. The structure also includes the following layers: a 2 µm $n^+$-GaAs layer 704 with a doping level of $5\times10^{18}$; a 0.3 µm $n^+$-$Al_{0.9}Ga_{0.1}As$ layer 706 with a doping level of $1\times10^{18}$; a 0.1 µm $n^+$-GaAs layer 708 with a doping level of $5\times10^{18}$; a 0.8 µm $n^{31}$ - GaAs layer 710 with a doping level of $4\times10^{16}$; a 1.2 µm $n^-$-GaAs layer 714 with a doping level of $4\times10^{16}$; a 2.5 µm $n^{30}$ -GaAs layer 716 with a doping level of $5\times10^{18}$; and a 0.03 µm $n^+$-$In_{0.4}Ga_{0.6}As$ layer 718. The structure of FIG. 8 includes a layer of $n^+$–GaAs 801, an active medium 812, and a layer of Au 818. The structure also includes the following layers: a 2 µm n+-GaAs layer 804 with a doping level of $5\times10^{18}$; a 0.3 µm $n^+$-$Al_{0.9}Ga_{0.1}As$ layer 806 with a doping level of $1\times10^{18}$; a 0.1 µm $n^+$-GaAs layer 808 with a doping level of $5\times10^{18}$; a 0.8 µm $n^{31}$ -GaAs layer 810 with a doping level of $4\times10^{16}$; a 3.5 µm $n^{31}$ -GaAs layer 814 with a doping level of $4\times10^{16}$; and a 0.23 µm $n^+$-GaAs layer 816 with a doping level of $5\times10^{18}$.

Each laser device element in the structure includes the core 101 sandwiched between $n^-$-GaAs optical confinement layers 110 and 112, which are themselves sandwiched between heavily-doped n-type GaAs ($n^+$-GaAs) cladding layers 106 and 108. The structure also optionally includes an additional cladding layer 409 of AlGaAs (e.g., $Al_{0.9}Ga_{0.1}As$) disposed between the lower optical confinement layer and the lower cladding layer. This high aluminum-content cladding layer 409 tends to improve the confinement, however, this material also has poor electrical conductivity. Therefore, in order to minimize resistance, cladding layer 409 should not be too thick and should be heavily doped. In some preferred embodiments, the $Al_{0.9}Ga_{0.1}As$ layer has a thickness of about 0.3 to about 0.5 µm and it is doped about $5\times10^{17}$ to $10^{18}$ cm$^{-3}$. Optionally, a thin layer of n$^+$-$In_{0.4}Ga_{0.6}As$ 406 may be grown on the upper cladding layer in order to suppress absorption losses to the metals that are eventually deposited on the structure for electrical contact. Since the lattice-mismatched $In_{0.4}Ga_{0.6}As$ layer is 30 nm thick, it may become partially relaxed, which may lead to the formation of defects. Such defects could alter the refractive index relative to a high-crystalline-quality material, impairing its ability to reduce absorption losses to the metal contact. Under such circumstances, it may be desirable to grow a small superlattice, e.g., 3-4 10 nm-thick $In_{0.4}Ga_{0.6}As$ wells separated by 5-6 nm-thick GaAs barriers, instead. The use of such GaAs spacers are known to significantly reduce the strain associated with using lattice-mismatched quantum wells.

The interelement regions may be made by etching the n$^+$-GaAs layer 110 in the interelement regions followed by regrowth with n$^-$-GaAs to form high refractive index interelement regions separating the neighboring laser device elements 402. Using $SiO_2$ as a mask for etch and regrowth, the n$^-$-GaAs regions are periodically introduced in the lateral direction to form high (effective) index interelement regions 404 for an antiguided array. Optionally, a thin layer of n$^+$-GaAs (not shown in FIG. 4, but shown in FIG. 8) is also part of the regrowth and placed above the n$^-$-GaAs material such as to allow for better overlap between the transverse field in the interelement regions and the transverse field in the element regions. Finally, the $SiO_2$ mask is removed and metal layers (e.g., titanium/gold) 408 are deposited over the device elements and interelement regions to provide a top electrode.

Figure 9:
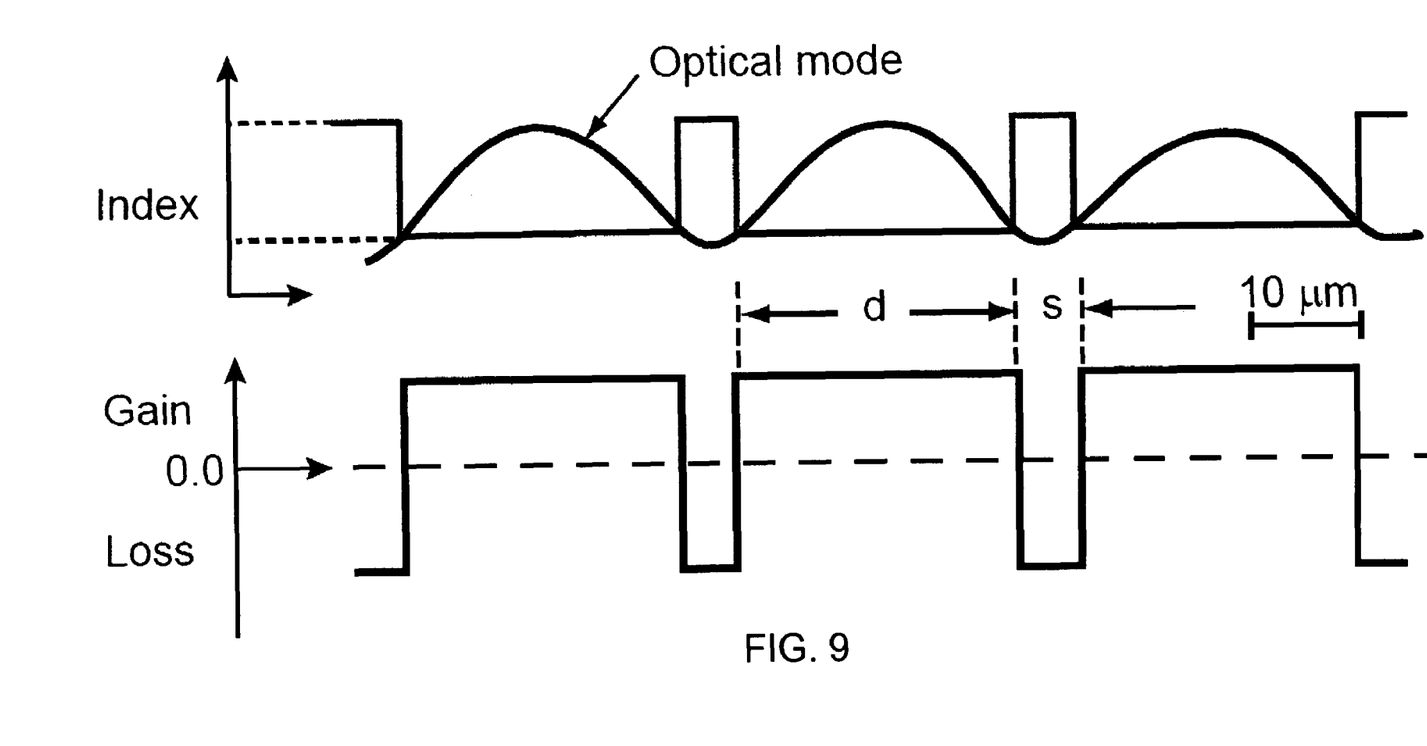
FIG. 9 shows a schematic representation of the APC laser structure operating at the lateral resonance of the desired in-phase mode.

The APC structure shown in FIG. 4, preferentially enhances gain in the low index regions and thereby provides single-spatial mode operation to high drive levels (>10× threshold) and high continuous wave (CW) power (e.g., $\geq 1$ W) while maintaining high wallplug efficiency (e.g., $\geq 50\%$). The desired in-phase mode, that is the mode for which the fields in adjacent elements are in phase with each other, is favored to lase at and near its lateral resonance, since ~99% of its energy lies in the high-gain, low-index APC regions, while higher-order APC modes are discriminated against via optical loss inserted in the high-index APC sites. This is illustrated in FIG. 9 by the schematic representation of the APC laser structure at the resonance of one in-phase mode; that is when the interelement region width s substantially corresponds to one projected half-wave. The fact that for intersubband devices the optical gain has a negligible effect on the injected-carrier profile and that thermal lensing will be negligible in CW-operated IQSB devices, insures single-spatial-mode operation to the high drive levels needed to achieve the maximum wallplug efficiency.

For certain applications it may be desirable to operate the present devices in the out-of-phase mode; that is an APC mode for which the fields in adjacent elements are out of phase with each other. The result is a far-field bean pattern composed of two lobes symmetrically placed with respect to the normal to the emitting aperture. Feedback can be provided via an external mirror on one lobe, while the output is obtained from the other lobe. For operation in a resonant out-of-phase mode the interelement spacing s substantially corresponds to an even number of projected half-waves. The desired number of projected half-waves is two.

As shown by the optical intensity profiles of FIGS. 5 and 6, the regrown high-index regions of the APC structure "draw" the field away from the active regions in the laser core thus achieving low modal gain due both to significantly reduced (transverse) field overlap with the active region and to strong absorption losses to the metal contact. Preferential lasing of the desired in-phase mode (FIG. 9) occurs at and near its lateral resonance. For $\lambda=4.6$ µm the lateral resonance is calculated to occur for s=6.5 µm, where s is the width of the high-index region (FIG. 9). At and near its resonance the in-phase mode has ~99% of its field in those regions while other modes have as little as 86% of their field in those regions. In turn, only ~1% of the in-phase mode "sees" the losses in the high-index regions while the high-order modes "see" significantly more loss. As an illustrative example, for a 4-element array it is calculated that in-phase mode lasing is favored over a ~1.0 µm-wide region in s variation. For beam-widths $\leq 2$ diffraction limit (D.L.) (i.e., a mixture of the in-phase mode and an adjacent mode) s can vary over a ~1.5 µm-wide region. Thus for both cases the fabrication tolerances are easily achievable via standard photolithography. In some embodiments, in order to get a significant amount of energy (e.g., ~70%) in the central far-field lobe, the array element width, d, (FIG. 9) desirably may be at least 5 times larger than s.

For the purposes of this disclosure and unless otherwise specified, "a" or "an" means "one or more". All patents, applications, references and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

While the principles of this invention have been described in connection with specific embodiments, it should be understood clearly that these descriptions are made only by way of example and are not intended to limit the scope of the invention.

What is claimed is:

1. A semiconductor laser having an active photonic crystal structure, the laser comprising:
   (a) an active medium comprising an array of laterally-spaced quantum box ministacks separated by a current blocking material, wherein each ministack comprises 2 to 5 vertically-stacked, coupled quantum boxes; and
   (b) a waveguide comprising a plurality of laterally-spaced first regions separated by a plurality of laterally-spaced second regions, wherein the first regions have a lower effective refractive index than the second regions, such that the first regions define laser device elements and the second regions define interelement regions.

2. The semiconductor laser of claim 1, wherein the waveguide comprises:
   (a) a first optical confinement layer disposed above the active medium;

(b) a second optical confinement layer disposed below the active medium;
(c) a first cladding layer disposed above and adjacent to the first optical confinement layer; and
(d) a second cladding layer disposed below and adjacent to the second optical confinement layer;
wherein the first and second regions are created by periodic variations in the thicknesses of one of the optical confinement layers and its adjacent cladding layer.

3. The semiconductor laser of claim 1, wherein each ministack has only two vertically stacked quantum boxes.

4. The semiconductor laser of claim 1, wherein each ministack has only three vertically stacked quantum boxes.

5. The semiconductor laser of claim 1, wherein the ministacks have lateral cross-sectional dimensions of no more than about 100 nm and heights of at least about 100 nm.

6. The semiconductor laser of claim 1, wherein the ministacks have lateral cross-sectional dimension of no more than about 50 nm and heights of at least about 150 nm.

7. The semiconductor laser of claim 1, wherein the ministacks are uniformly spaced in the array and the spacing between ministacks is no more than about 100 nm.

8. The semiconductor laser of claim 1, wherein the ministacks are spaced in the array and the spacing between the ministacks is no more than about a ministack diameter.

9. The semiconductor laser of claim 1, wherein the quantum boxes comprise an electron injector coupled to an active region coupled to an electron reflector, the active region comprising a quantum well layer that includes at least one deep quantum well.

10. The semiconductor laser of claim 9, wherein the electron injector comprises alternating layers of GaAsP and AlGaAs, the electron reflector comprises alternating layers of GaAsP and InGaAs, and the active region comprises a quantum well layer of InGaAs disposed between barrier layers of AlGaAs.

11. The semiconductor laser of claim 1, wherein the current blocking material comprises semi-insulating GaAs.

12. The semiconductor laser of claim 2, wherein the active medium is formed of a GaAs material system, the first and second optical confinement layers comprises lightly-doped n-type GaAs, the laterally-spaced regions having the lower effective refractive index comprise heavily-doped n-type GaAs, and the laterally-spaced regions having the higher effective refractive index comprise lightly-doped n-type GaAs.

13. The semiconductor laser of claim 12, further comprises an additional cladding layer comprising AlGaAs disposed between the second optical confinement layer and the second cladding layer.

14. The semiconductor laser of claim 12, further comprising an additional cladding material comprising InGaAs disposed over the first cladding layer.

15. The semiconductor laser of claim 14, wherein the additional cladding material comprises a superlattice of alternating layers of InGaAs and GaAs.

16. The semiconductor laser of claim 1, having an output power of at least 1 Watt.

17. The semiconductor laser of claim 1, having a wallplug efficiency of at least 30%.

18. The semiconductor laser of claim 1, having a wallplug efficiency of at least 50%.

19. The semiconductor laser of claim 1, wherein the laser emits light with wavelengths in the range of 3 to 5 μm.

20. The semiconductor laser of claim 19, wherein the laser operates at room temperature.

21. The semiconductor laser of claim 1, wherein spacing between the laser device elements is adapted to allow the semiconductor laser to operate in a resonant in-phase mode.

22. The semiconductor laser of claim 1, wherein the spacing between the laser device elements is adapted to allow the semiconductor laser to operate in a resonant out-of-phase mode.

* * * * *